United States Patent [19]

Galton

[11] Patent Number: 5,684,482
[45] Date of Patent: Nov. 4, 1997

[54] SPECTRAL SHAPING OF CIRCUIT ERRORS IN DIGITAL-TO-ANALOG CONVERTERS

[75] Inventor: Ian A. Galton, 36 Urey Ct., Irvine, Calif. 92715

[73] Assignee: Ian A. Galton, Del Mar, Calif.

[21] Appl. No.: 610,557

[22] Filed: Mar. 6, 1996

[51] Int. Cl.[6] .................................................. H03M 1/66
[52] U.S. Cl. ........................................ 341/144; 341/148
[58] Field of Search .................................. 341/148, 154, 341/144, 150

[56] References Cited

U.S. PATENT DOCUMENTS

| | | | |
|---|---|---|---|
| 4,441,136 | 4/1984 | Hampshire | 361/88 |
| 5,187,482 | 2/1993 | Tiemann et al. | 341/143 |
| 5,404,142 | 4/1995 | Adams et al. | 341/144 |

OTHER PUBLICATIONS

James C. Candy, et al., "Oversampling Methods For A/D and D/A Conversion,"*Oversampling Delta–Sigma Data Converters Theory, Design and Simulation*, IEEE Press, 1992, pp. 1–29.

Max W. Hauser, "Principles Of Oversampling A/D Conversion," *J. Audio Eng. Soc.*, vol. 39, No. 1/2, Jan./Feb. 1991, pp. 3–26.

L. Richard Carley, et al., "A 16-Bit 4'TH Order Noise-Shaping D/A Converter", *Proceedings Of The IEEE 1988 Custom Integrated Circuits Conference*, Rochester, New York, May 16–19, 1988, pp. 21.7.1–21.7.4.

Solomon W. Golomb, *Shift Register Sequences*, Holden-Day, Inc., pp. 24–74.

Mohammed Ismail, et al., *Analog VLSI Signal and Information Precessing*, McGraw–Hill, Inc., 1994, pp. 467–500.

Rudy Van De Plassche, *Integrated Analog–To–Digital and Digital–To–Analog Converters*, Kluwer Academic Publishers, 1994, pp. 413–451.

Kenneth R. Laker, et al., *Design Of Analog Integrated Circuits and Systems*, McGraw–Hill, Inc., pp. 169–244.

R. Shreier, et al., "Noise–Shaped Multibit D/A Convertor Employing Unit Elements", *Electronics Letters*, Sep. 28, 1995, vol. 31, No. 20, pp. 1712–1713.

Tat C. Choi, et al., "High–Frequency CMOS Switched–Capacitor Filters For Communications Application," *IEEE Journal Of Solid–State Circuits*, vol. SC–18, No. 6, Dec. 1983, pp. 652–664.

L. Richard Carley, "A Noise–Shaping Coder Topology For 15+ Bit Converters," *IEEE Journal Of Solid–State Circuits*, vol. 24, No. 2, Apr. 1989, pp. 267–273.

Rudy J. Van De Plassche, "Dynamic Element Matching For High–Accuracy Monolithic D/A Converters," *IEEE Journal Of Solid–State Circuits*, vol. Sc–11, No. 6, Dec. 1976, pp. 795–800.

(List continued on next page.)

*Primary Examiner*—Jeffrey A. Gaffin
*Assistant Examiner*—Jason A. Vick
*Attorney, Agent, or Firm*—Knobbe, Martens, Olson & Bear LLP

[57] ABSTRACT

A general digital-to-analog (DAC) topology spectrally shapes the DAC conversion noise caused by analog circuit mismatches. In particular, highly practical first-order and second-order noise-shaping DACs are special cases of a general topology. The topology extends the practicality of using noise-shaping DACs in $\Delta\Sigma$ data converters. The first-order DAC is at least as hardware efficient as previously known DACs, but offers the advantage that it is amenable to a simple dithering technique capable of eliminating spurious tones. The second-order DAC is more hardware efficient than previously known DACs, and generally has a large spurious-free dynamic range without any dithering. Moreover, the present invention allows DACs with other types of noise-shaping characteristics (e.g., bandpass noise-shaping characteristics) to be designed based on general DAC topology.

19 Claims, 12 Drawing Sheets

OTHER PUBLICATIONS

Rudy J. Van De Plassche, et al., "Monolithic 14-Bit D/A Converter," *IEEE Journal Of Solid–State Circuits*, vol. SC–14, No. 3, Jun. 1979, pp. 552–556.

Rex T. Baird, et al., "Linearity Enhancement Of Mulitbit ΔΣ A/D and D/A Converters Using Data Weighted Averaging," *IEEE Transactions On Circuits and Systems*, vol. 42, No. 12, Dec. 1995, pp. 753–762.

Ning He, et al., "Double–Loop Sigma–Delta Modulation With DC Input," *IEEE Transactions On Communications*, vol. 38, No. 4, Apr. 1990, pp. 487–495.

Bosco H. Leung, et al., "Multibit Σ–Δ A/D Converter Incorporating a Novel Class Of Dynamic Element Matching Techniques", *IEEE Transactions On Circuits and Systems*, vol. 39, No. 1, Jan. 1992, pp. 35–51.

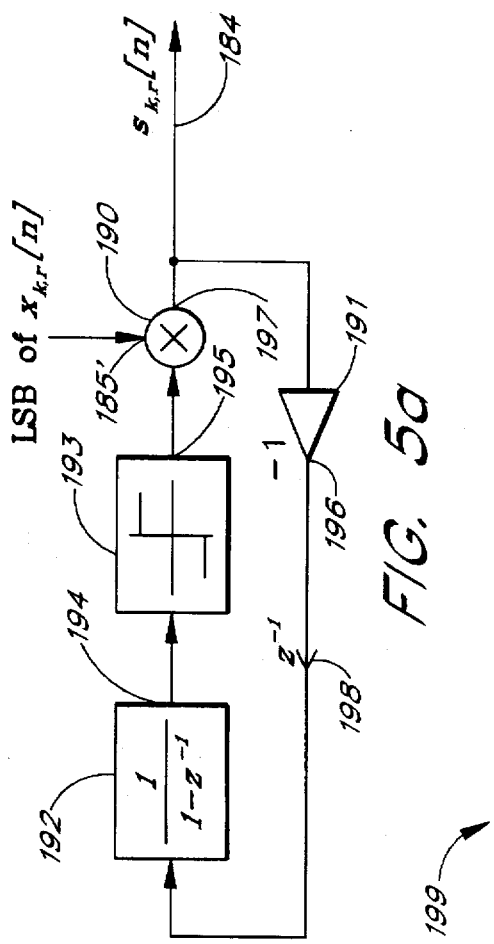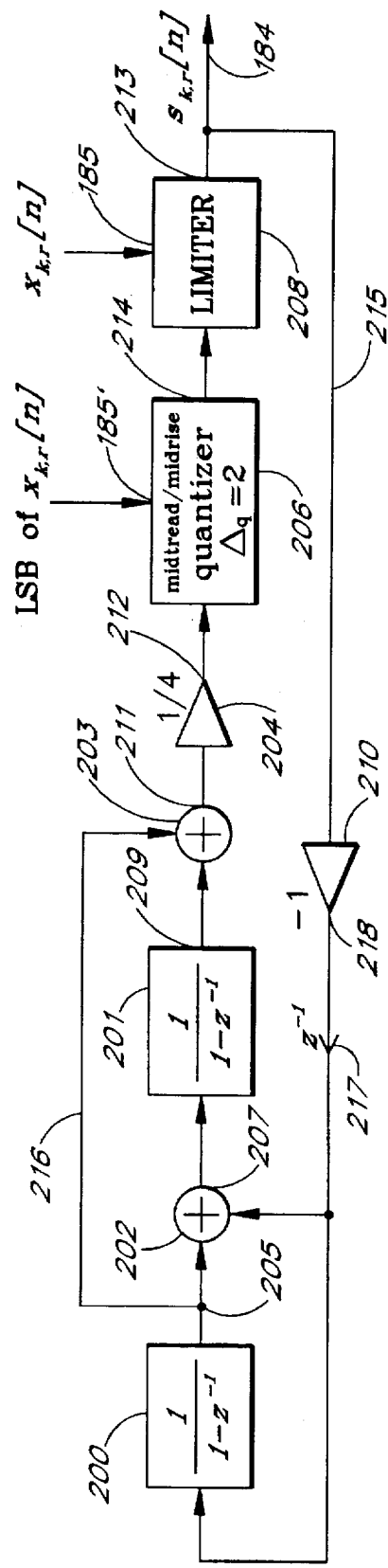

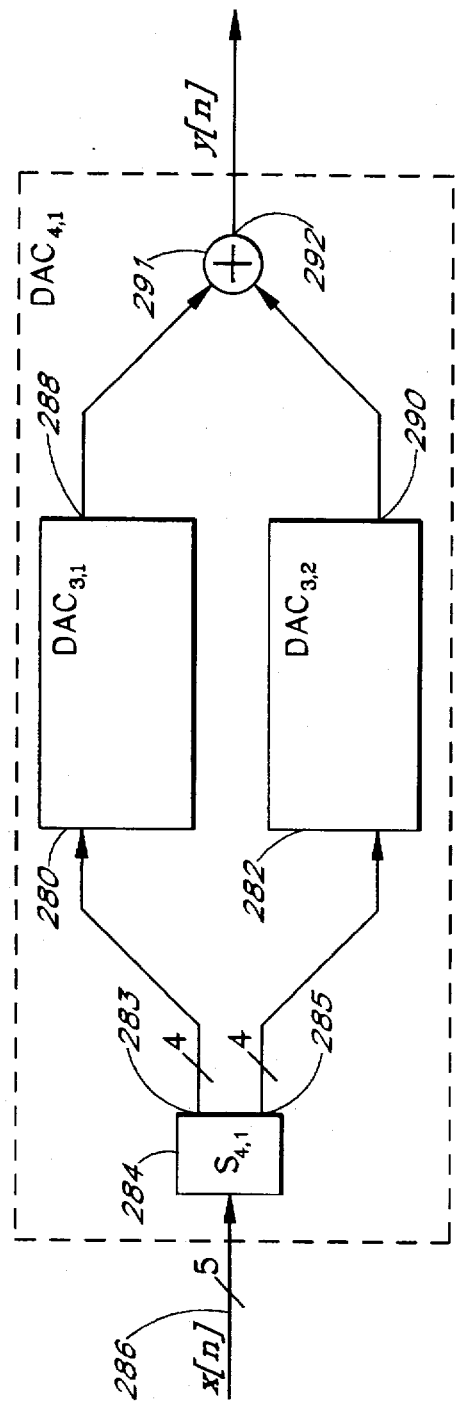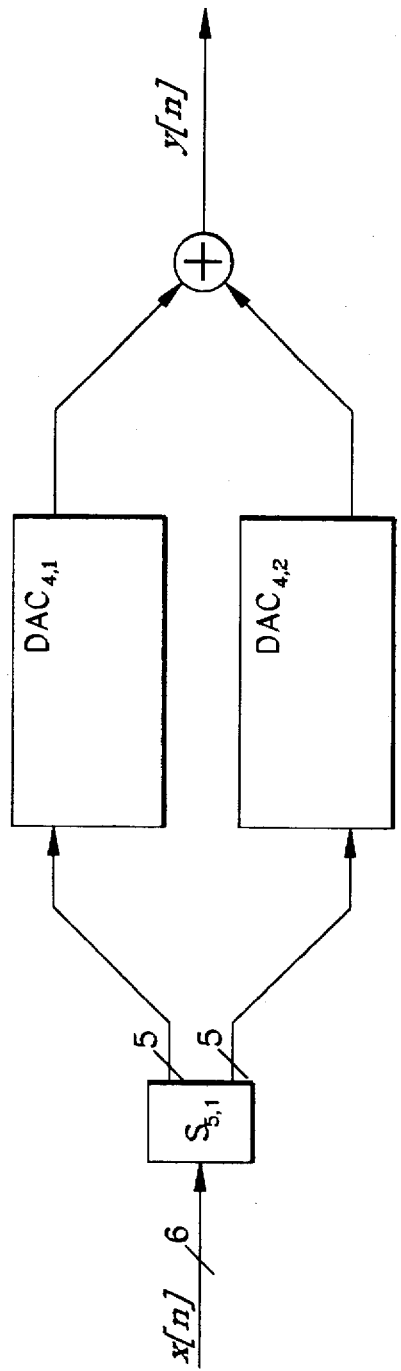

SPECTRAL SHAPING OF CIRCUIT ERRORS IN DIGITAL-TO-ANALOG CONVERTERS

BACKGROUND OF THE INVENTION

1. Field of the Invention

The present invention is in the field of delta-sigma data converters.

2. Description of the Related Art

Delta-sigma analog-to-digital converters (ΔΣADCs) and delta-sigma digital-to-analog converters (ΔΣDACs) are prevalent in digital audio applications and are gradually replacing traditional ADCs and DACs in higher-rate applications such as in digital cellular telephones. Because these converters achieve high-precision conversion without requiring high-precision analog components, they tend to be amenable to implementation in VLSI processes optimized for digital circuitry. Hence, they can be integrated directly with digital signal processing algorithms giving rise to smaller, lighter, and less expensive systems than possible using traditional approaches.

In both ΔΣADCs and ΔΣDACs—collectively referred to as delta-sigma (ΔΣ) data converters—coarse quantization is used to simplify the analog processing, but oversampling and quantization noise-shaping are used to achieve high precision data conversion despite the coarseness of the quantization. For example, in a ΔΣDAC the digital input sequence first is digitally interpolated to a higher samplerate so that it occupies a low frequency portion of the discrete-time spectrum referred to as the signal band. The interpolated sequence is coarsely quantized by a digital ΔΣ modulator which uses a quantizer in conjunction with feedback such that the error introduced by the quantization process—referred to as quantization noise—falls primarily outside the signal band. The coarsely quantized sequence is then converted to an analog sequence by a coarse DAC and a subsequent chain of analog lowpass filters is used to remove the portion of the quantization noise outside the signal band. The result is a high-precision analog representation of the original digital sequence despite the use of only a very coarse DAC. The operation of a ΔΣADC is similar except that the quantization in the ΔΣ modulator is performed by a coarse ADC and the feedback path contains a coarse DAC.

In terms of sensitivity to non-ideal circuit behavior, the "weak link" in a delta-sigma data converter usually is the coarse DAC. Because of circuit errors such as component mismatches, the DAC introduces conversion noise. Unlike most other sources of error in the system, the signal-band component of the conversion noise is not attenuated by the processing chain, so it directly degrades the overall signal-to-noise-ratio (SNR) of the ΔΣ data converter. To the extent that the conversion noise consists of harmonic distortion, the spurious-free dynamic range (SFDR) of the data converter is also reduced.

The conversion noise introduced by present multi-bit DACs so limits the performance of ΔΣ data converters that it has been common practice to use single-bit (i.e., two-level) DACs. To the extent that the errors in the two analog output levels of a single-bit DAC are static (time-invariant), the DAC only introduces constant gain and offset errors. Consequently, ΔΣ data converters with single-bit DACs are not generally limited by DAC conversion noise. Unfortunately, the processing performed by such data converters necessarily involves single-bit quantization which gives rise to performance-limiting effects such as reduced input range, conditional stability, and spurious tonal behavior.

Recently, various innovative multi-bit DAC architectures have been proposed for which the conversion noise is spectrally shaped like quantization noise in ΔΣ modulators. Thus, when used in ΔΣ data converters, the same filters that remove much of the quantization noise also remove much of the DAC conversion noise. These architectures employ digital algorithms to perform this noise-shaping of errors introduced by non-ideal analog circuit behavior, and the algorithms require no specific knowledge of the particular analog errors that are introduced. This is in sharp contrast to a conventional ΔΣ modulator wherein the noise-shaping algorithm makes use of previous quantization error values via the feedback around the quantizer.

The noise-shaping DACs represent exciting developments because they promise to greatly advance the present precision limits of ΔΣ data converters by eliminating the need for one-bit quantization. To date, first-order and second-order noise-shaping DAC architectures have been demonstrated in the literature via simulation results. However, the only architecture of these that achieves greater than first-order noise-shaping requires clock-rate digital number sorting, and therefore has a high implementation complexity.

SUMMARY OF THE INVENTION

The present invention is a hardware-efficient DAC topology that can be used to achieve a variety of conversion noise-shaping characteristics. The present invention encompasses specific first and second-order noise-shaping DACs as special cases of the topology. The second-order DAC, in particular, is considerably more hardware efficient than its previously presented counterpart. Additionally, the present invention spectrally shapes the conversion noise even though the sources of the conversion noise—the errors introduced by the analog circuitry—are not known to the noise-shaping algorithm.

A first aspect of the present invention is a digital-to-analog converter that converts an N-level digital input sequence to a nominally equivalent analog output sequence comprised of a digital encoder that converts each sample of said N-level digital input sequence to multiple digital output values and a converter for converting said multiple digital output values to the nominal analog equivalent of the sum of said multiple digital output values. The digital encoder consists of one or more switching blocks, with each switching block having one digital input and two digital outputs. The sum of the two digital outputs of each switching block equals the input.

A further aspect of the present invention is a digital-to-analog converter that converts an N-level digital input sequence to a nominally equivalent analog output sequence where N is a positive power of two and the converter includes a digital encoder comprising of up to N−1 switching blocks. Each switching block is denoted uniquely as $S_{k,r}$ for integers k in the range $a \leq k \leq b$ where $b=\log_2(N)$ and a is a fixed number in the range $1 \leq a \leq b$, and integers r in the range $1 \leq r \leq N/2^k$. For each $a \leq k \leq b$, the two outputs, $x_{k-1,2r-1}[n]$ and $x_{k-1,2r}[n]$, of a switching block $S_{k,r}$ are connected to the inputs of a switching blocks $S_{k-1,2r-1}$ and $S_{k-1,2r}$, respectively. The outputs of switching blocks $S_{a,r}$ for $r=1, \ldots, N/2^a$ are the multiple digital outputs of the digital encoder, and the input to switching block, $S_{b,1}$ is connected to the N-level digital input sequence.

An added aspect of the present invention is a digital-to-analog converter having a digital input and an analog output, with the analog output being an analog equivalent of the input. The DAC contains at least one switching block layer interposed between the input and the output. This switching block layer includes at least one switching block having an input signal and two output signals. Each output signal has a value in the range $\{0, 1, \ldots, 2^{k-1}\}$, where k is the layer number. The sum of the output signals also equals the input signal. A plurality of digital-to-analog converters (DACs) are connected to receive the output signal from switching blocks in the switching block layer logically closest to the converters. After converting these signals to analog, an adder combines each DAC output into said single analog output.

Another aspect of the present invention is an element of a recursive digital-to-analog converter. The element is a digital-to-analog converter comprising a switching block interposed between the input and the output. The switching block has an input signal and first and second output signals of k bits, wherein each output signal has a value in the range $\{0, 1, \ldots, 2^{k-1}\}$. The input signal also equals a sum of the output signals. The element includes a first digital-to-analog converter (DAC) having an input and an output. The input to the first DAC is connected to receive the first output of the switching block, where the output of the first DAC is an analog equivalent of the input. A second DAC having an input and an output is also included. The input to the second DAC receives the second output of the switching block, where the output of the second DAC is an analog equivalent of the input. An adder is connected to receive the outputs of the first and second DAC. The adder combines the DAC outputs into the single analog output.

An additional aspect of the present invention is a method of achieving digital-to-analog conversion. The method comprises the steps of receiving a digital input signal in a first switching block layer of a plurality of switching block layers. The next step splits the digital signal into two output signals. Each of the two output signals has a value in the range $\{0, 1, \ldots, 2^{k-1}\}$, where k is a layer number, and a sum of the output signals equals the digital input signal. These steps are repeated for each of the plurality of switching block layers where the output signals of a k layer are the digital input signals for a k-1 layer. The output signals of the last switching block layer are converted into a plurality of analog signals. The last step combines the plurality of analog signals into a single converted signal.

A further aspect of the present invention is a method of achieving digital-to-analog conversion. The method comprises the steps of receiving a digital input signal in a switching block, where the input signal is a k+1 bit signal. The next step splits the digital signal into two output signals. Each of the two output signals has a value in the range $\{0, 1, \ldots, 2^{k-1}\}$, where k is the number of bits of each output signal, and a sum of the output signals equals the digital input signal. The output signals are converted into a first analog signal and a second analog signal. The first and second analog signals are combined into a single converted signal.

BRIEF DESCRIPTION OF THE DRAWINGS

FIG. 3b is a graphical representation of simulated power spectral density of conventional first order, second order and ideal DACs driven by a 3-bit, third-order digital $\Delta\Sigma$ modulator with a sinusoidal excitation of a different frequency than in FIG. 3a.

FIG. 5a is a block diagram of the switching block calculation of $s_{k,r}[n]$ for the first-order noise shaping DAC of the present invention.

FIG. 5b is a block diagram of the switching block calculation of $s_{k,r}[n]$ for the second-order noise shaping DAC of the present invention.

FIG. 8a is a block diagram of the DAC topology of a 4-bit DAC of the present invention.

FIG. 8b is a block diagram of the DAC topology of a 5-bit DAC of the present invention.

DETAILED DESCRIPTION OF THE PREFERRED EMBODIMENT

Figure 1:
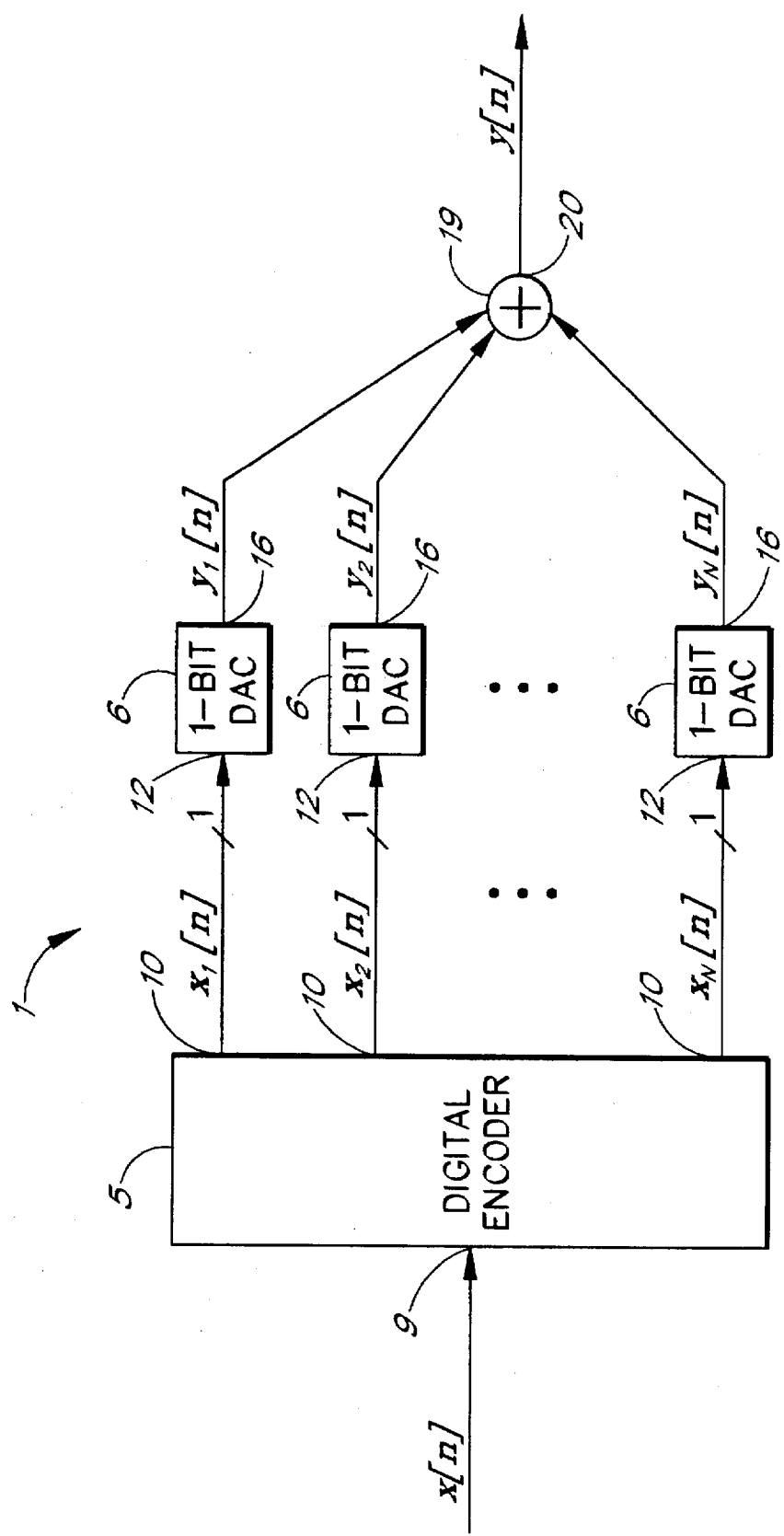
FIG. 1 is a block diagram of noise shaping DACs in the prior art.

Noise-shaping DAC architectures presented to date have the general form shown in FIG. 1. Each DAC architecture 1 comprises a digital encoder 5 and N one-bit DACs referred to as unit DAC-elements 6. A digital input sequence called x[n] is taken to be a sequence of non-negative integers less than or equal to N. The sequence is fed to an input 9 of the digital encoder 5. The digital encoder 5 maps each input sample to N output bits $x_1[n], x_2[n], \ldots x_N[n]$ on N outputs 10 such that the sum of the N bits is equal to x[n]:

$$x_1[n] + x_2[n] + \ldots + x_N[n] = x[n] \qquad (1)$$

Each output bit $x_i[n]$ is provided as a corresponding input 12 to the unit DAC-elements 6. The unit DAC-elements 6 operate to create N output signals $y_1[n], y_2[n], y_N[n]$ on respective outputs 16 according to:

$$y_r[n] = \begin{cases} 1 + e_{h_r}, & \text{if } x_r[n] = 1; \\ e_{l_r}, & \text{if } x_r[n] = 0; \end{cases} \qquad (2)$$

where $y_r[n]$ denotes the analog output of the $r^{th}$ unit DAC-element 6, and $e_{h_r}$ and $e_{l_r}$ are errors in the analog output levels. Each output signal $y_r[n]$ is then provided as an input to an adder 19 which sums the outputs to create an analog signal y[n] on an output 20. Because the digital encoder 5 implements equation (1), if the errors $e_{h_r}$ and $e_{l_r}$ were all zero then the output of the DAC, y[n] would equal the input 9, x[n], exactly. However, in practice the errors are not zero because of the non-ideal circuit behavior, so $$y[n] = \alpha x[n] + \beta + e[n] \qquad (3)$$

where $\alpha$ is a constant gain, $\beta$ is a DC offset, and e[n] is zero-mean conversion noise. Therefore, non-ideal circuit behavior results in a non-unity gain, a non-zero DC offset, and non-zero conversion noise.

The coarse DACs required for $\Delta\Sigma$ data converters are typically implemented using switched-capacitor unit DAC-elements which each dump an ideally fixed amount of charge into the summing node of an op-amp based integrator (the adder 19) during each sample interval in which the input bit is high. To a large extent, the relative errors introduced by the unit DAC-elements arise from mismatches in fabricated capacitor dimensions. Consequently, to a high degree of accuracy, $e_{h_r}$ and $e_{l_r}$ are time-invariant. For this reason, $e_{h_r}$ and $e_{l_r}$ are assumed to be time-invariant, but otherwise arbitrary, and are referred to as static mismatch errors.

All of the noise-shaping DAC architectures to date exploit the fact that the digital encoder 5 has many ways that it can choose its output bits $x_i[n]$ and still satisfy equation (1). Thus, the digital encoder 5 can modulate the conversion noise component of y[n] without affecting the signal component. The noise-shaping DACs are able to perform this modulation such that the conversion noise is spectrally shaped like $\Delta\Sigma$ modulator quantization noise.

Figure 2:
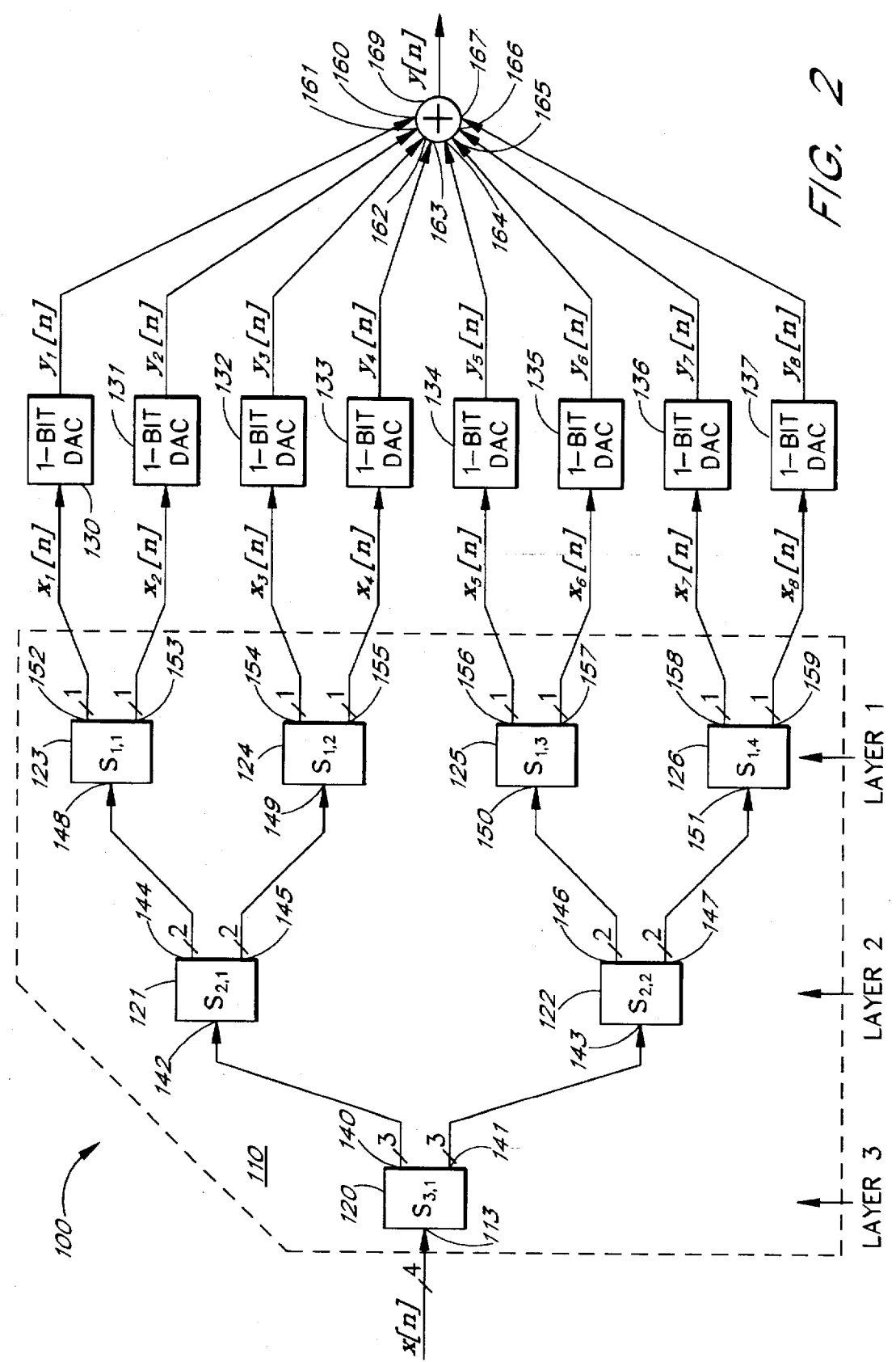
FIG. 2 is a block diagram of one example of the DAC topology of the present invention.

The noise-shaping DAC topology 100 of the present invention is shown in FIG. 2. For simplicity, a 3-bit version is shown, but the topology and all of the results are easily generalized to any number of bits. The input bus 113 is actually 4-bits wide to accommodate the possibility of the number eight, represented by the binary number $1000_2$. Although the one four-bit number can be input, this topology 100 will be referred to as a 3-bit DAC to maintain consistency. The topology 100 is a special case of that shown in FIG. 1. The digital encoder 110 of FIG. 2 comprises three layers of digital devices called switching blocks 120–126 and labeled $S_{k,r}$, where k denotes a layer number and r denotes a position of the switching block 120–126 in its respective layer. Additionally, the topology 100 includes eight one-bit DACs 130–137 and an adder 169.

A digital signal x[n] is input into the switching block 120 via a four-bit bus 113. As indicated in the figure, x[n] can be up to a four-bit signal, however its value is limited to the range 0 ... 8. The switching block 120 splits the input signal into two 3-bit output signals on outputs 140 and 141. The signal on output 140 is fed to an input 142 of the switching block 121, while the signal on output 141 is fed to an input 143 of the switching block 122. The switching blocks 121 and 122 receive the respective three-bit signals on the inputs 142 and 143 and split them into four two-bit output signals on outputs 144–147. These outputs signals are applied as inputs 148–151 of the next layer of switching blocks comprising the blocks 123–126. In particular, the signal on the output 144 from the switching block 121 is fed to the input 148 of the switching block 123; the signal on the output 145 from the switching block 121 is fed to the input 149 of the switching block 124; the signal on the output 146 from the switching block 122 is fed to the input 150 of the switching block 125; and the signal on the output 147 from the switching block 122 is fed to the input 151 of the switching block 126. The switching blocks 123–126 convert the four two-bit signals on the inputs 148–151 into eight one-bit signals on the outputs 152–159. These one-bit signals are represented as $x_1[n] \ldots x_8[n]$, respectively.

Because switching blocks 123–126 comprise the final layer of switching blocks, the eight one-bit output signals on the lines 152–159 are provided as inputs to the eight one-bit DACs 130–137. The output 152 of the switching block 123 is provided as the input to the DAC 130, and the output 153 of the switching block 123 is provided as the input to the one-bit DAC 131. The output 154 of the switching block 124 is provided as the input to the one-bit DAC 132, and the output 155 of the switching block 124 is provided as the input to the one-bit DAC 133. The output 156 of the switching block 125 is provided as the input into DAC 134, and the output 157 of the switching block 125 is provided as the input to the one-bit DAC 135. The output 158 of the switching block 126 is provided as the input to the one-bit DAC 136 and the output 159 of the switching block 126 is provided as the input to the one-bit DAC 137.

The eight one-bit DACs 130–137 convert the input signals $x_1[n] \ldots x_8[n]$ into eight analog signals $y_1[n] \ldots y_8[n]$ on outputs 160–167. These eight signals $y_1[n] \ldots y_8[n]$ on the outputs 160–167 are provided as inputs to the adder 169 which sums the inputs to generate a multiple-level analog output signal y[n].

The details of the switching blocks 120–126 will be described below. As set forth above, each digital input sample, x[n], is mapped by the three layers of switching blocks 120–126 to 8 output bits $x_1[n] \ldots x_8[n]$, which satisfy equation (1) with N=8. It can be easily verified that this will happen provided each switching block satisfies a number conservation rule in accordance with the present invention. The number conservation rule of the present invention states:

the two outputs of each switching block must be in the range $\{0, 1, \ldots, 2^{k-1}\}$ where k is the layer number, and the sum of the outputs must equal the value of the input to the switching block.

For example, if $x[n_0]=6$, then the number conservation rule is satisfied by the Layer 3 switching block if its two outputs at time $n_0$ are any of the following pairs: (3, 3), (4, 2) or (2, 4). For this example, provided all of the switching blocks satisfy the number conservation rule, then six of the bits $x_1[n_0], \ldots x_8[n_0]$ from the last layer (layer 1) would equal one, and two would equal zero.

Additionally, the present invention can be achieved by replacing the one-bit DACs 130–137 in FIG. 2 with multiple bit DACs. For example, if a two-bit DAC replaces each one-bit DAC, one layer of switching blocks (Layer 1) is removed. With this topology, the outputs 144–147 of switching blocks 121, 122 are provided as the inputs to the two-bit DACs. If desired, this theory allows multiple layers of switching blocks to be replaced by multiple bit DACs.

The two specific noise-shaping DACs described herein have the topology shown in FIG. 2 with switching blocks that satisfy the number conservation rule. The two DACs differ in the details of how their switching blocks operate to thereby provide a first-order (L=1) DAC and a second order (L=2) DAC. These differences give rise to markedly different conversion noise behavior. As will be shown, the conversion noise from the two DACs is spectrally shaped in the same fashion that quantization noise is shaped in first and second order $\Delta\Sigma$ modulators, respectively. That is, the conversion noise is well modeled as the output of a highpass filter $N_L(z)=(1-z^{-1})^L$ driven by white noise, where L=1 and L=2, respectively. Consequently, in each case the power spectral density (PSD) of the conversion noise is proportional to $\sin^{2L}(\omega/2)$. By analogy with $\Delta\Sigma$ modulator terminology, the DACs will be referred to as first-order (L=1) and second-order (L=2) noise-shaping DACs, respectively.

Before presenting the details of the switching blocks for the two DACs, the above statements are demonstrated via simulation results. For comparison purposes, a conventional DAC and an ideal DAC are also simulated. The conventional DAC is taken to have the form of FIG. 1 with a digital encoder 5 that satisfies:

$$x_k[n] = \begin{cases} 1, & \text{if } k \leq x[n]; \\ 0, & \text{otherwise}. \end{cases} \quad (4)$$

Thus, the digital encoder 5 satisfies equation (1), and the resulting conversion noise is a memoryless, deterministic function of the input. The ideal DAC is taken to have the form of FIG. 1 with zero mismatch errors. Consequently, the ideal DAC introduces no conversion noise whatsoever.

Figure 3A:
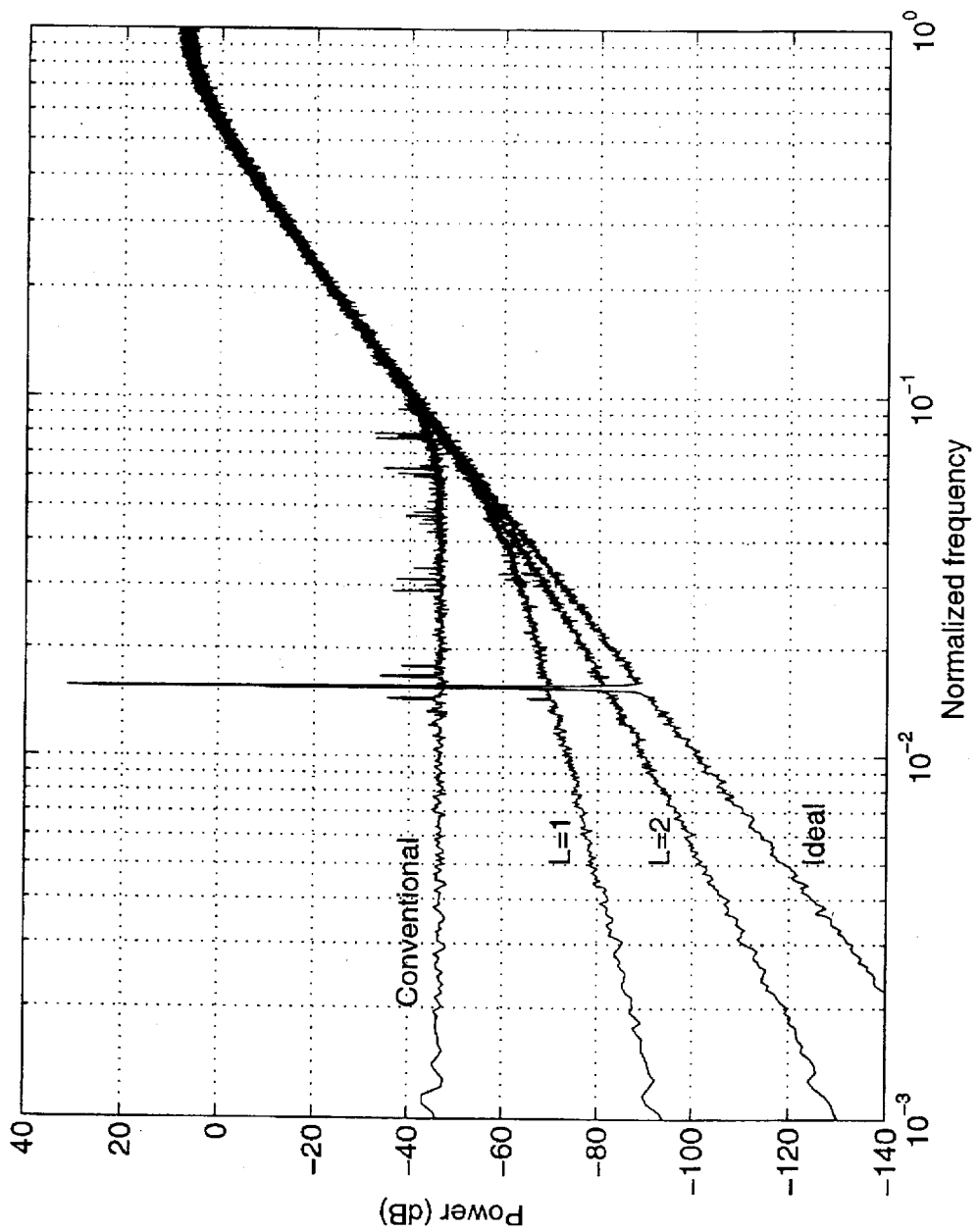
FIG. 3a is a graphical representation of simulated power spectral density of conventional first order, second order and ideal DACs driven by a 3-bit, third-order digital $\Delta\Sigma$ modulator with a sinusoidal excitation.

FIG. 3a shows simulation data representing the output PSDs of a conventional DAC, a first-order noise-shaping DAC, a second-order noise-shaping DAC, and an ideal DAC, all driven by the same 3-bit third-order digital $\Delta\Sigma$ modulator with a sinusoidal excitation. All but the ideal DAC had the same set of static mismatch errors which were chosen from a Gaussian distribution with a standard deviation of 1%. The choice of a Gaussian distribution here is incidental. None of the results of this invention depend on the distribution or correlation properties of the static mismatch errors. The PSDs are in units of dB relative to the nominal least-significant bit (LSB) value of the DACs (this is also the step-size of the $\Delta\Sigma$ modulator).

Figure 3B:
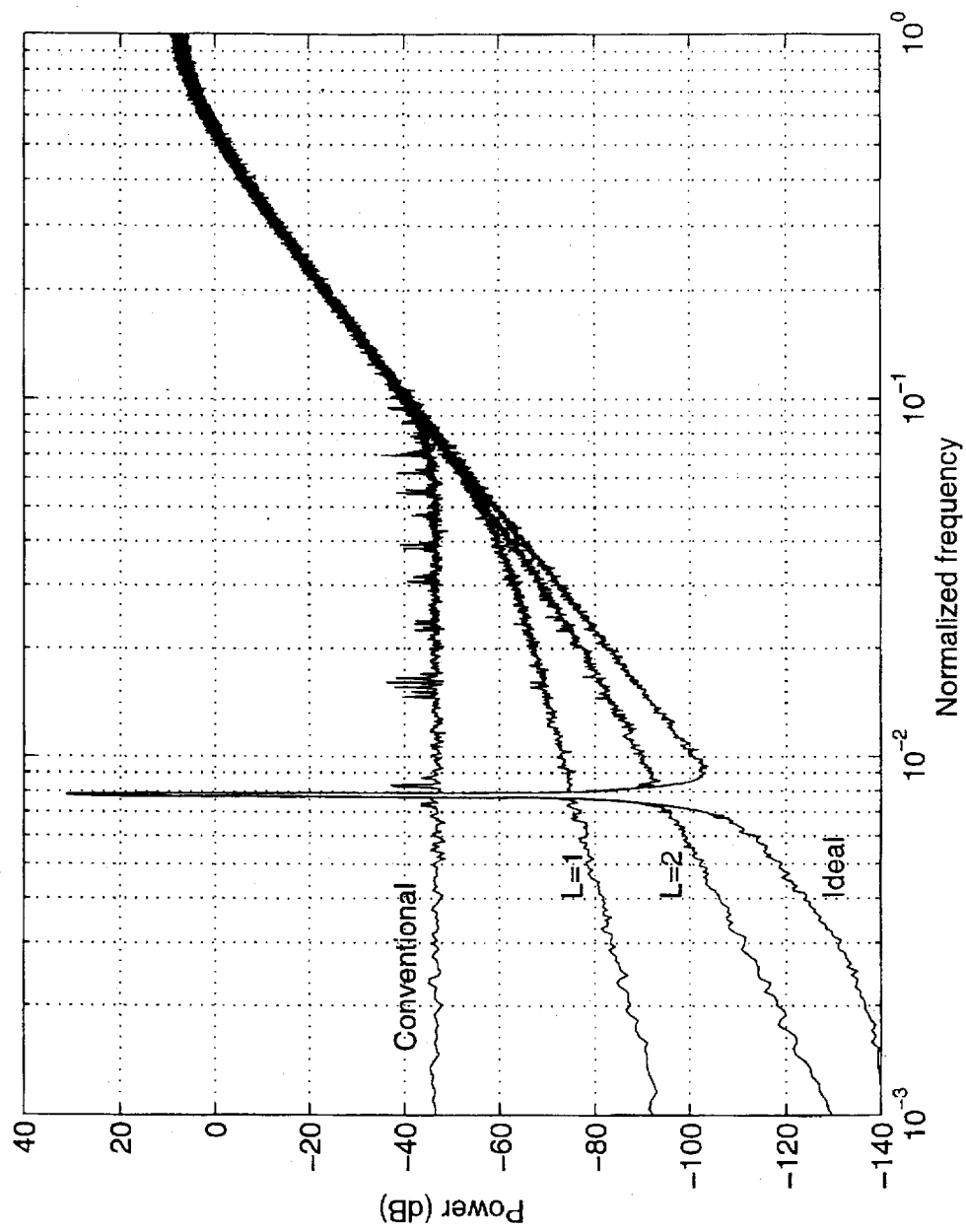

No conversion noise was introduced by the ideal DAC, so the PSD of the ideal DAC output is equal to that of the 3-bit, third-order digital $\Delta\Sigma$ modulator output. Accordingly, the PSD consists of third-order shaped quantization noise with a discrete spectral frequency component corresponding to the sinusoidal excitation of the $\Delta\Sigma$ modulator. As expected from well-known $\Delta\Sigma$ modulator results, the quantization noise component decreases by 18 dB per octave decrease in frequency. Each of the PSDs associated with the other three DACs differs from that of the ideal DAC because of an additional component corresponding to the conversion noise. As is evident from FIG. 3a, for the conventional DAC this component gives rise to a flat noise-floor at about −45 dB with considerable spurious tone content. For the first-order and second-order DACs, the component gives rise to noise-floors that decrease by 6 dB and 12 dB per octave decrease in frequency, respectively, with very little spurious tone content. Similar data are shown in FIG. 3b for a sinusoidal input of a different frequency, and in FIG. 3c for a sinusoidal input with an extremely small amplitude (not visible above the noise floor). In each case, the simulation data clearly support the assertions made above that the first-order and second-order DACs gives rise to first-order and second-order shaped conversion noise, respectively. FIG. 3d shows attainable bit precisions versus oversampling ratios between 2 and 200 as obtained from integrating the data of FIG. 3c.

Figure 4:
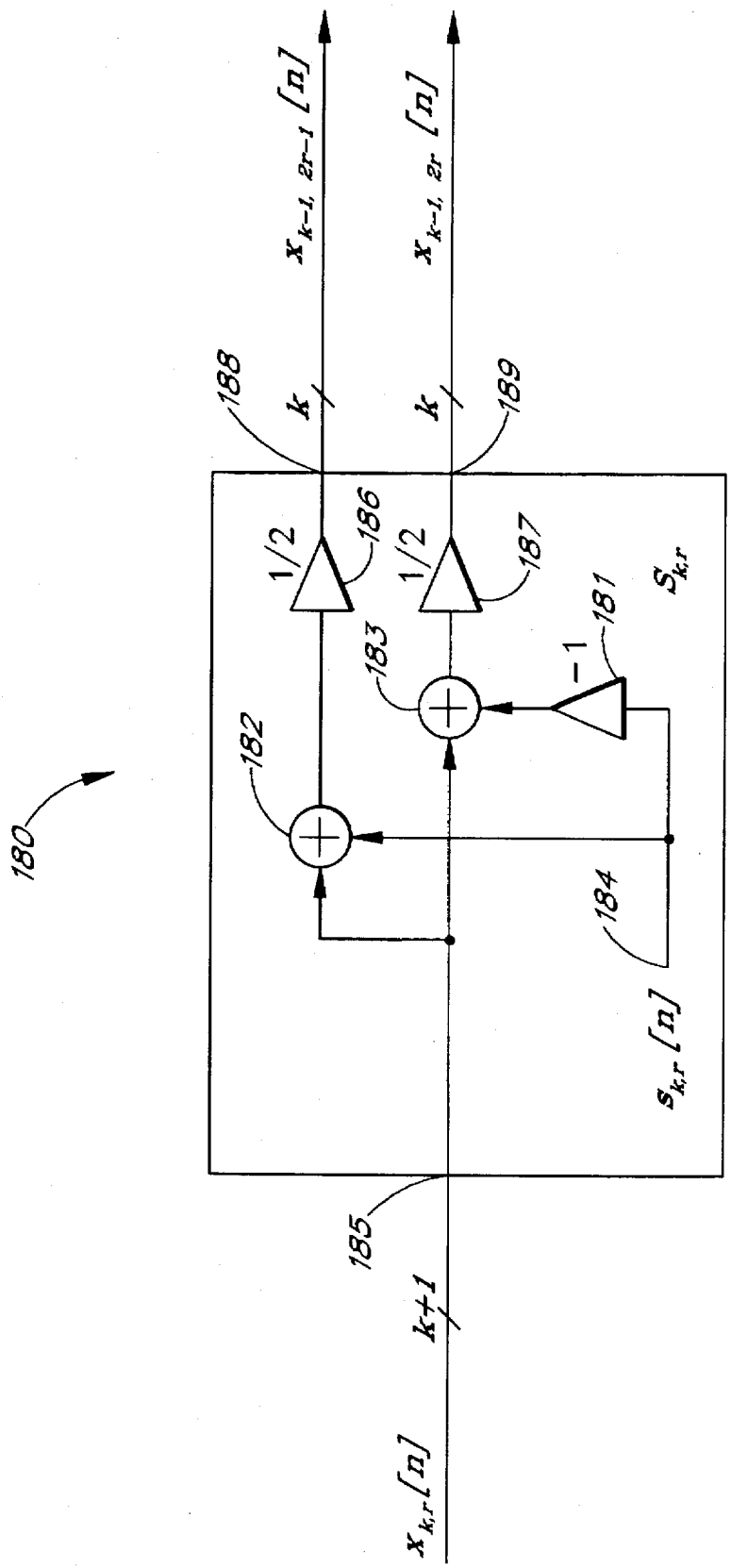
FIG. 4 shows the switching blocks of FIG. 2 in block format.

From a signal processing point-of-view, the switching blocks associated with the two noise-shaping DACs considered herein perform the operations shown in FIG. 4. A switching block 180 can be represented by a control signal 184, a −1 gain element 181, two adders 182–183, and two ½ gain elements 186–187.

The control signal 184 is generated within the switching block 180 as described below. The control signal 184 is then sent to a first input to an adder 182 and to the input to the −1 gain element 181. The output of the −1 gain element 181 is then input into a first input to a second adder 183. An input signal 185 of (k+1) bits is input into the switching block 180. This input signal 185 is fed respectively into second inputs of both adders 182 and 183. The output of adder 182 is sent through the ½ gain element 186, and the output of the adder 183 is input into the ½ gain element 187. The outputs of the gain elements 186 and 187 are the switching block 180 output signals 188 and 189. These signals 188 and 189 are k bits wide, or one bit less than the input signal 185. In each case, the control signal 184, denoted $s_{k,r}[n]$, is a sequence generated within the switching block 180, and the differences between the two DACs lie only in the algorithms their respective switching blocks use to calculate the control signal $s_{k,r}[n]$ 184. The algorithm will be described below.

It follows from FIG. 4 that $$s_{k,r}[n] = x_{k-1,2r-1}[n] + x_{k-1,2r}[n]. \quad (5)$$

Because the control signal $s_{k,r}[n]$ 184 determines the difference between the two outputs of the $S_{k,r}$ switching block, it follows that the control signal $s_{k,r}[n]$ 184 must satisfy certain conditions for the number conservation rule to be satisfied. Specifically, it can easily be verified that if all the switching blocks have the form shown in FIG. 4, and for every k and r, the control signal $s_{k,r}[n]$ 184 satisfies:

$$s_{k,r}[n] = \begin{cases} \text{even} & \text{if } x_{k,r}[n] \text{ is even}; \\ \text{odd} & \text{if } x_{k,r}[n] \text{ is odd}; \end{cases} \quad (6)$$

and $$|s_{k,r}[n]| \leq \min\{x_{k,r}[n], 2^k - x_{k,r}[n]\}, \quad (7)$$

then the switching blocks all satisfy the number conservation rule.

The block diagrams shown in FIG. 5 indicate the signal processing operations performed by the switching blocks to generate the control signal $s_{k,r}[n]$ 184 in the first-order and second-order noise-shaping DACs considered herein. Together with the structure in FIG. 4, the structures in FIGS. 5a and 5b represent the signal processing operations performed by the complete $S_{k,r}$ switching block for the first-order (L=1) and the second-order (L=2) noise-shaping DACs, respectively. As will be shown below, simple gate-level implementations of these switching blocks exist. However, the two structures shown in FIG. 5 will first be explained at the signal processing level.

The $S_{k,r}$ switching block 180 associated with the first-order DAC generates the control signal $s_{k,r}[n]$ 184 as shown in FIG. 5a. It consists of an LSB-multiplier 190, a −1 gain element 191, a discrete time integrator 192, a hard limiter 193 and a delay element 198 interconnected as a feedback loop. The least significant bit (LSB) 185' of the input signal 185 to the switching block 180 (FIG. 4) is input into the LSB-multiplier 190. The output 195 of the hard limiter 193 is also input into the LSB-multiplier 190. The output 197 of the multiplier 190 is the control signal 184. The control signal 184 is supplied to the switching block 180 as described above. The control signal 184 is also input into the feedback loop as the input to the −1 gain element 191. The signal output 196 of the −1 gain element 191 is delayed one clock cycle by the delay element 198, then provided as the input to the discrete time integrator 192. The output of the integrator 194 is provided as the input to the hard limiter 193. As discussed above, the output 195 of the hard limiter 193 is one of the two inputs to the LSB-multiplier 190.

The $S_{k,r}$ switching block 199 which generates the control signal $s_{k,r}[n]$ 184 for the second-order DAC is shown in FIG. 5b. The structure is similar to a second-order $\Delta\Sigma$ modulator. It consists of two discrete-time integrators 200 and 201, two adders 202 and 203, two gain elements 204 and 210, a quantizer 206, a delay element 217 and an amplitude limiter 208 interconnected as a double feedback loop.

The LSB 185' of the input signal 185 is provided as an input to the quantizer 206. The entire input signal 185 is also provided as an input to the limiter 208. The quantizer 206 has a step-size of $\Delta_q=2$ and performs midtread quantization when the LSB of the input to the switching block is 0, and performs midrise quantization otherwise. This quantizer arrangement forces the control signal $s_{k,r}[n]$ 184 to satisfy equation (6). An output 214 of the quantizer 206 is provided as an input to the limiter 208. An output 213 of the limiter 208 is the control signal $s_{k,r}[n]$ 184. The amplitude limiter 208 clips the output 214 of the quantizer 206 if necessary to force the control signal $s_{k,r}[n]$ 184 to satisfy equation (7).

The control signal 184 from the output 213 of the limiter 208 is provided back into the double feedback loop 215 as an input to the $-1$ gain element 210. An output 218 from the $-1$ gain element 210 is delayed one clock cycle by the delay element 217 and then provided as an input for the adder 202 and for the first integrator 200. An output 205 of the first integrator 200 is provided as a second input to the first adder 202. The output 205 is also provided to the feed forward path 216 as an input to the second adder 203. The adder 202 adds its inputs 218 and 205 to provide an output signal 207. The output signal 207 is provided as an input to the second integrator 201. An output 209 of the second integrator 201 is provided as an input to the second adder 203. The second adder 203 adds its two inputs to provide an output signal 211. The output signal 211 is provided as an input to the ¼ gain element 204. An output 212 of the ¼ gain element 204 is provided as an input to the quantizer 206. The quantizer 206 thus receives two inputs—the signal 212 and the least significant bit of the input signal 185.

The limiter 208 and the quantizer 206 together can be viewed as introducing additive error. An analysis of the filtering performed by the structure of FIG. 5b indicates that the control signal $s_{k,r}[n]$ 184 is a second-order shaped version of this error. However, note that aside from the quantizer 206 and limiter 208, the structure differs from that of a conventional second-order $\Delta\Sigma$ modulator because it has the ¼ gain element 204 preceding the quantizer 206 and has an extra feed-forward path 216 between the output 205 of the integrators 200 and the adder 203. These modifications reduce the variance of the input to the quantizer 206 so as to reduce the likelihood of exceeding the range of the limiter 208 at any given time.

Although the structures of FIGS. 5a and 5b used by the switching blocks to generate the control signal $s_{k,r}[n]$ 184 sequences are similar to $\Delta\Sigma$ modulators, they differ in that they have no input sequences. Therefore, the discrete-time integrator inputs are always small integer values. If integer initial conditions are used, it follows that the state variables of the structures are always bounded integer values. Consequently, the structures can be implemented with low bit-width registers and arithmetic.

Figure 6A:
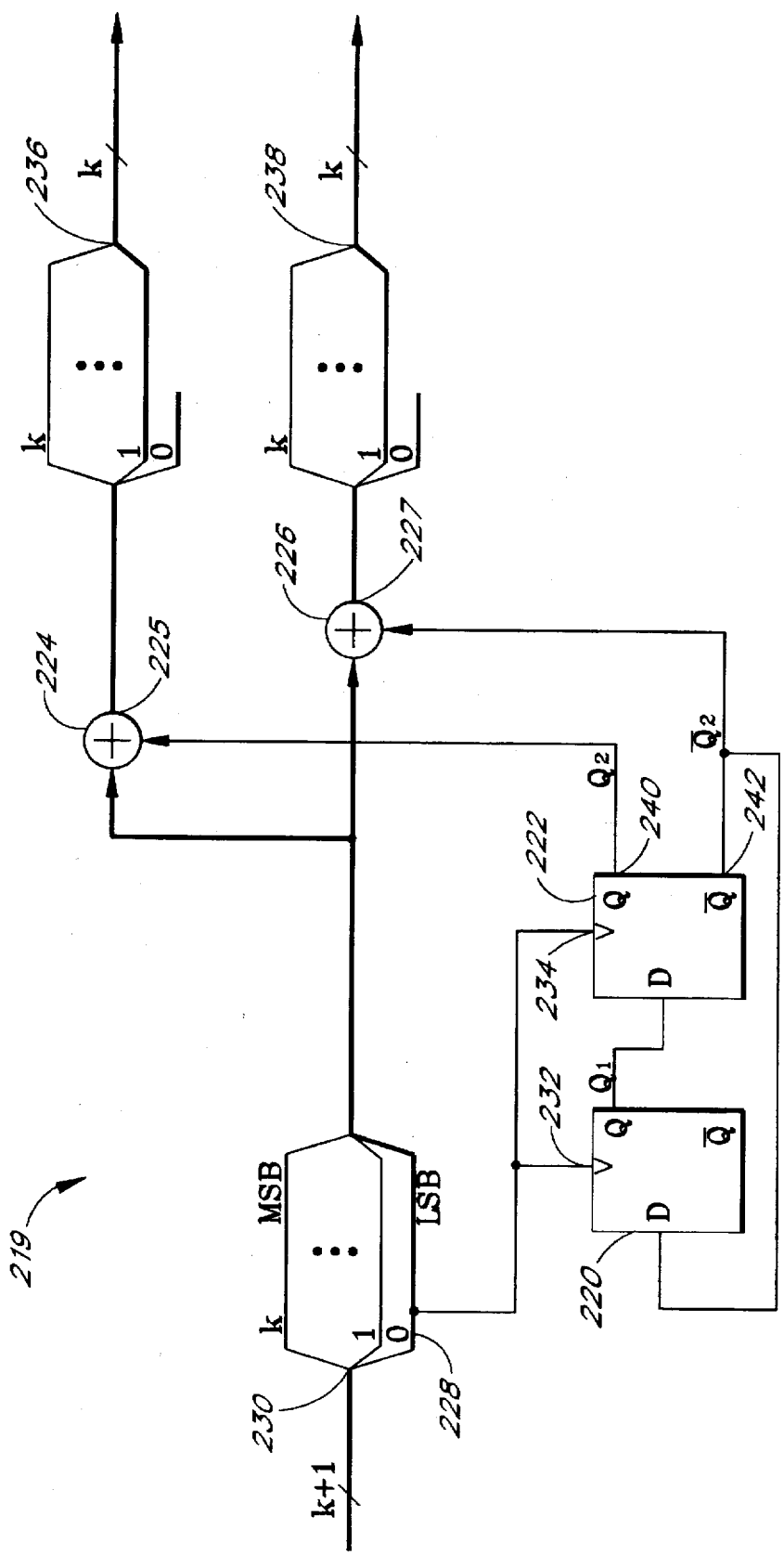
FIG. 6a is a schematic diagram of a hardware efficient implementation of the switching block for the first-order DAC of the present invention.

For example, the gate-level implementation of the switching block 219 for the first-order DAC is shown in FIG. 6a. It comprises two D flip-flops 220, 222, and two LSB-adders 224, 226 (i.e., adders that each calculate the sum of a 1-bit number and a (k+1)-bit number). The LSB 228 of the input 230 to the switching block 219 is provided as clock inputs 232, 234 to the two flip-flips 220, 222 which are connected in a four-state configuration with the Q output of the first flip-flop 220 connected to the data input to the second flip-flop 222 and the $\overline{Q}$ output of the second flip-flop 222 provided to the data input to the first flip-flop 220. The Q output 240 of the second flip-flop 222 is input into the adder 224 and the $\overline{Q}$ output 242 of the second flip-flop 222 is input into the adder 226. Each adder 224 and 226 also has as inputs the input signal 230 to the switching block 219. The k most-significant-bits of outputs 225 and 227 to the adders 224 and 226 are the outputs 236 and 238 to the switching block 219.

It can be verified that the switching block 219 of FIG. 6a performs the function of the system shown in FIG. 4 with the control signal $s_{k,r}[n]$ 184 generated by the system shown in FIG. 5a for the appropriate choice of initial conditions. The two flip-flops 220 and 222 in FIG. 6a play the role of the discrete-time integrator 192 in the system of FIG. 5a. Denoting the Q outputs of the two flip-flops 220, 222 as $Q_1$ and $Q_2$, respectively, it can be verified that the state ($Q_1=1$, $Q_2=1$), corresponds to an integrator state of 1, the state ($Q_1=0$, $Q_2=0$) corresponds to an integrator state of $-1$, and the states ($Q_1=0$, $Q_2=1$) and ($Q_1=1$, $Q_2=0$) both correspond to an integrator state of 0.

Any spurious tones contained in the control signal $s_{k,r}[n]$ 184 sequences, will appear in the conversion noise. Given that the switching block sequences for the first-order and second-order noise-shaping DACs are generated by the $\Delta\Sigma$ modulator-like structures of FIG. 5, and given that the quantization noise introduced by undithered $\Delta\Sigma$ modulators often contains spurious tones, it follows that low-level spurious tones are visible in the PSDs of the two simulated noise-shaping DACs of FIGS. 3a–3c. However, the tones have a small amplitude. In all cases shown, the spurious-free dynamic range is greater than 90 dB.

Figure 3C:
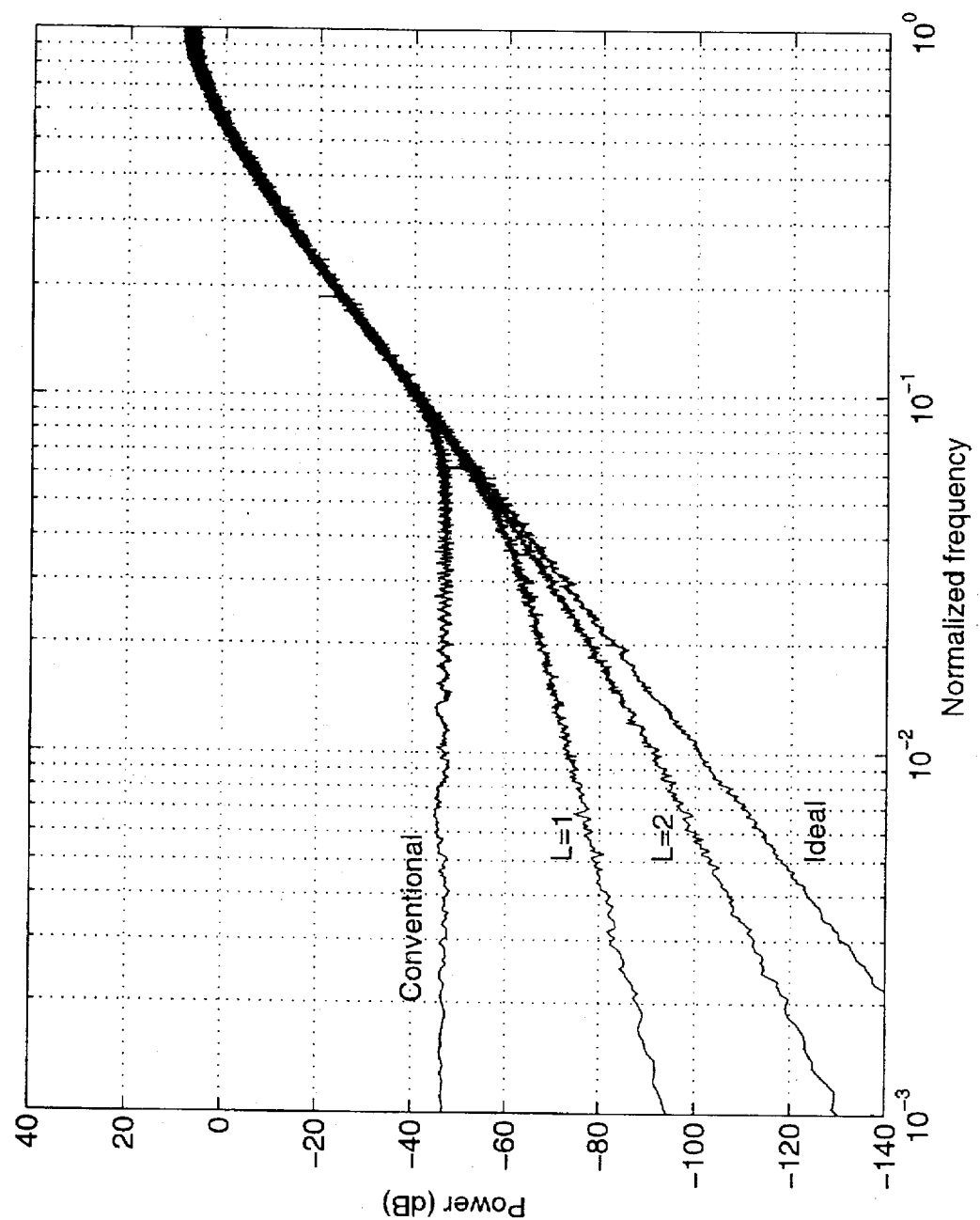
FIG. 3c is a graphical representation of simulated power spectral density of conventional first order, second order and ideal DACs driven by a 3-bit, third-order digital $\Delta\Sigma$ modulator with a sinusoidal excitation with an extremely small amplitude.
Figure 3D:
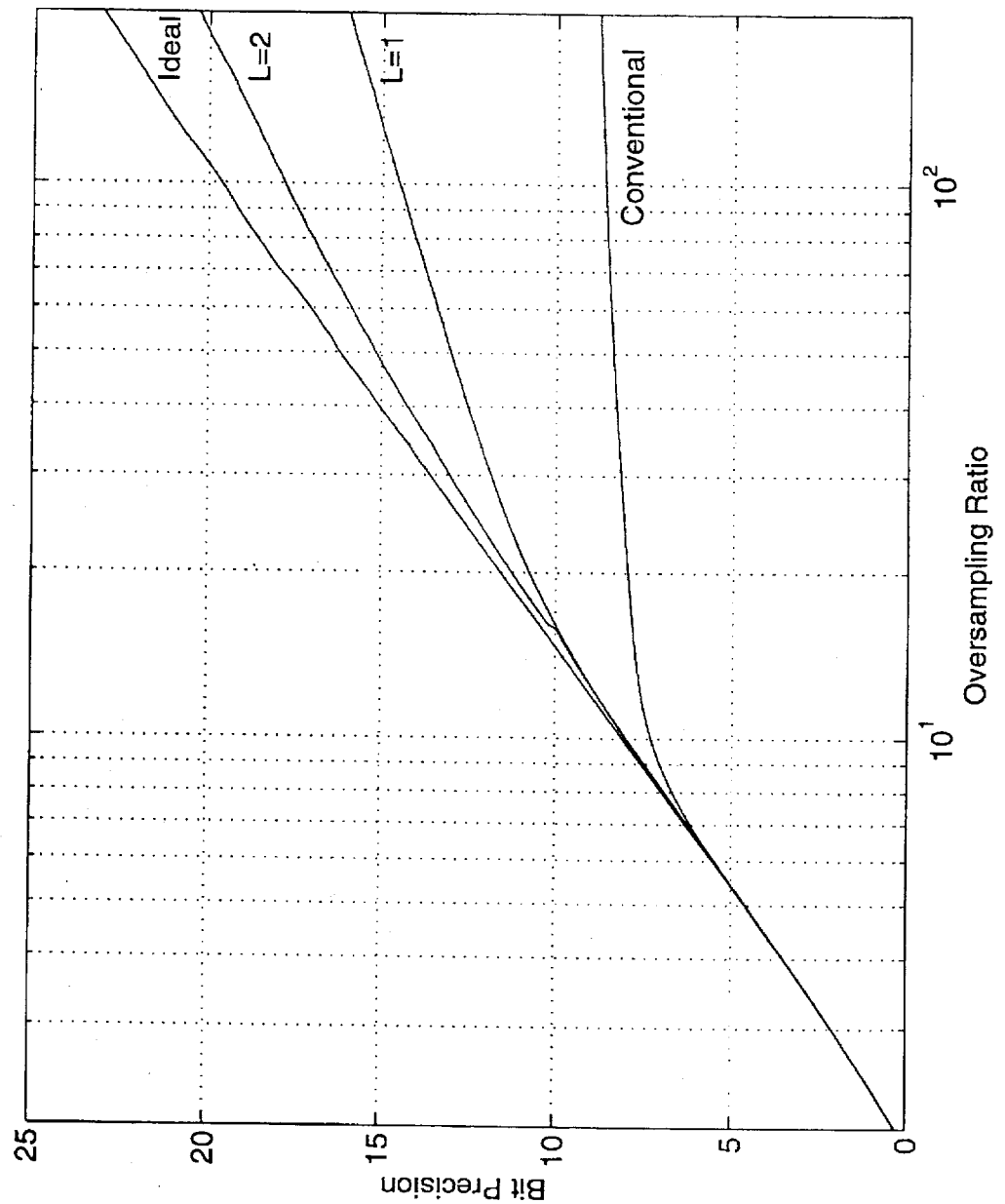
FIG. 3d is a diagram showing corresponding bit precisions versus oversampling ratio as obtained from the simulated power spectral densities shown in FIG. 3c of conventional first order, second order and ideal DACs driven by a 3-bit, third-order digital $\Delta\Sigma$ modulator with a sinusoidal excitation.

In the simulations of FIGS. 3a, 3b and 3c, the discrete-time integrators used to generate the switching block sequences all have initial conditions of zero so their state variables are restricted to small integer values. If either irrational initial conditions or low-level dither at the discrete-time integrator inputs are used for the simulations, no tones are visible in the resulting PSDs. These results are consistent with existing $\Delta\Sigma$ modulator theory. Unfortunately, even approximate implementations of these methods for eliminating spurious tones result in considerable hardware complexity.

In the case of the second-order noise-shaping DAC, the simulation data shown in FIGS. 3a–3c indicate that the spurious tones have extremely low amplitudes. However, the first-order noise-shaping DAC tends to generate larger-amplitude spurious tones. A practical approach to suppressing these tones is as follows. For the structure of FIG. 5a with an initial condition of 0, it is easily verified that at each sample time the input to the hard limiter 193 is either a 0, 1, or $-1$. By definition, the output of the hard limiter 193 is a 1 when its input is positive and a $-1$ when its input is negative. Consequently, quantization error is introduced only when the input to the hard limiter 193 is a 0, in which case the quantization error has a magnitude of 1. However, an input to 0 is midway between the two possible output values of the hard limiter. Consequently, the total mean-squared error would not be changed if the hard limiter 193 is replaced by a device that operates according to $$v_{k,r}[n] = \begin{cases} 1, & \text{if } u_{k,r}[n] = 1; \\ -1, & \text{if } u_{k,r}[n] = -1; \\ r[n], & \text{if } u_{k,r}[n] = 0; \end{cases} \quad (8)$$

where $v_{k,r}[n]$ is the output of the device, $u_{k,r}[n]$ is the input to the device, and $r_{k,r}[n]$ is a random ±1 sequence that is white, independent of x[n], and uncorrelated with the $r_{k,r}[n]$ sequences in the other switching blocks. When the hard limiters in all the switching blocks are replaced by these devices, all spurious tones are suppressed.

Figure 6B:
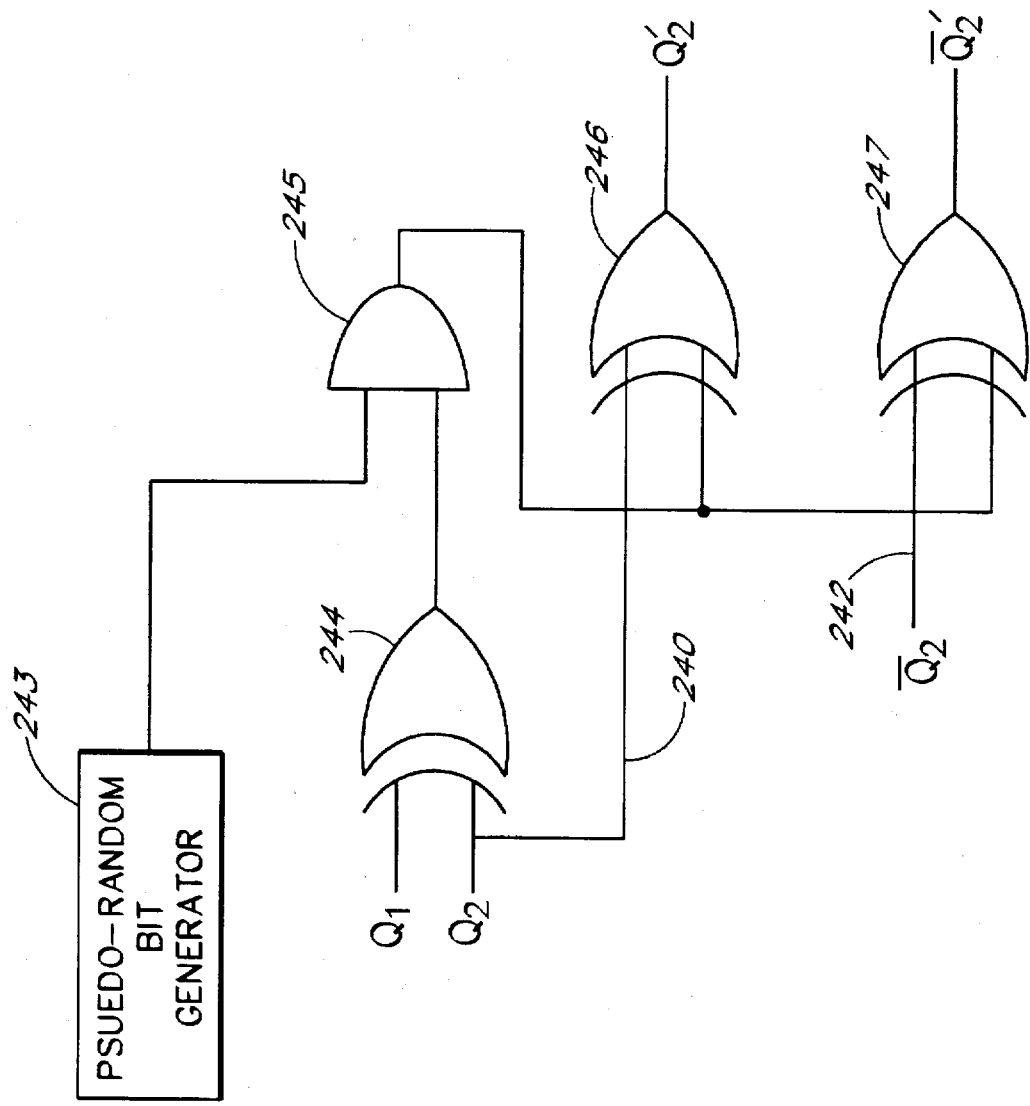
FIG. 6b is a schematic diagram of a hardware efficient implementation of the dithering scheme for the first-order DAC of the present invention.

This dithering scheme for the switching block implementation shown in FIG. 6a can be implemented by the circuit shown in FIG. 6b. In the disclosed embodiment, the dithering scheme comprises a pseudo-random bit generator 243, three exclusive-OR gates 244, 246, 247 and an AND gate 245. The exclusive-OR gate 244 has inputs Q1 and Q2 from the flip-flops 220 and 222 (FIG. 6a). The output of the exclusive-OR gate 244 is provided as a first input to the AND gate 245. The pseudo-random bit generator 243 provides a second input to the AND gate 245. The output of the AND gate 245 is provided as a second input to both the exclusive-OR gate 246 and the exclusive-OR gate 247. The Q2 output 240 of the second flip-flop 222 (FIG. 6a) is provided as a first input to the exclusive-OR gate 246. The $\overline{Q2}$ output 242 of the second flip-flop 222 (FIG. 6a) is provided as a first input to the exclusive-OR gate 247. The exclusive-OR gate 246 has an output Q2' and the exclusive-OR gate 247 has an output $\overline{Q2}'$. When dithering, the output Q2' replaces the Q output 240 of the second flip-flop 222 as the input into the adder 224 (FIG. 6a). The output $\overline{Q2}'$ replaces the $\overline{Q2}$ output 242 of the second flip-flop 222 as the input into the adder 226 (FIG. 6a).

The exclusive-OR gate 244 is used to detect the equivalent of a discrete-time integrator 192 (FIG. 5) output of 0. When the output of the exclusive-OR gate 244 is high, simple logic comprising the AND gate 245 and the exclusive-OR gates 246, 247 is used to randomly invert or not invert Q2 and $\overline{Q2}$. Pseudo-random ±1 sequences that approximate the desired statistics are simple to generate using feedback shift registers (not shown). See, for example, S. W. Golomb, *Shift Register Sequences*, San Francisco, Calif., Holden-Day, 1967.

A partial implementation of the dithering scheme can be used as a compromise between hardware complexity and spurious tone suppression. Specifically, if dithering is used in only some of the switching blocks, then some tone suppression is achieved and the resulting DAC is more hardware efficient than if dithering is used in all the switching blocks. For example, in the simulated first-order noise-shaping DAC associated with FIG. 3, only the $S_{3,1}$ switching block is dithered. Of course, there are many ways to implement this dithering scheme, and the specific embodiment shown and described herein is only one example. Equivalent implementations of the dithering scheme can be achieved without departing from the spirit of the invention.

Figure 7:
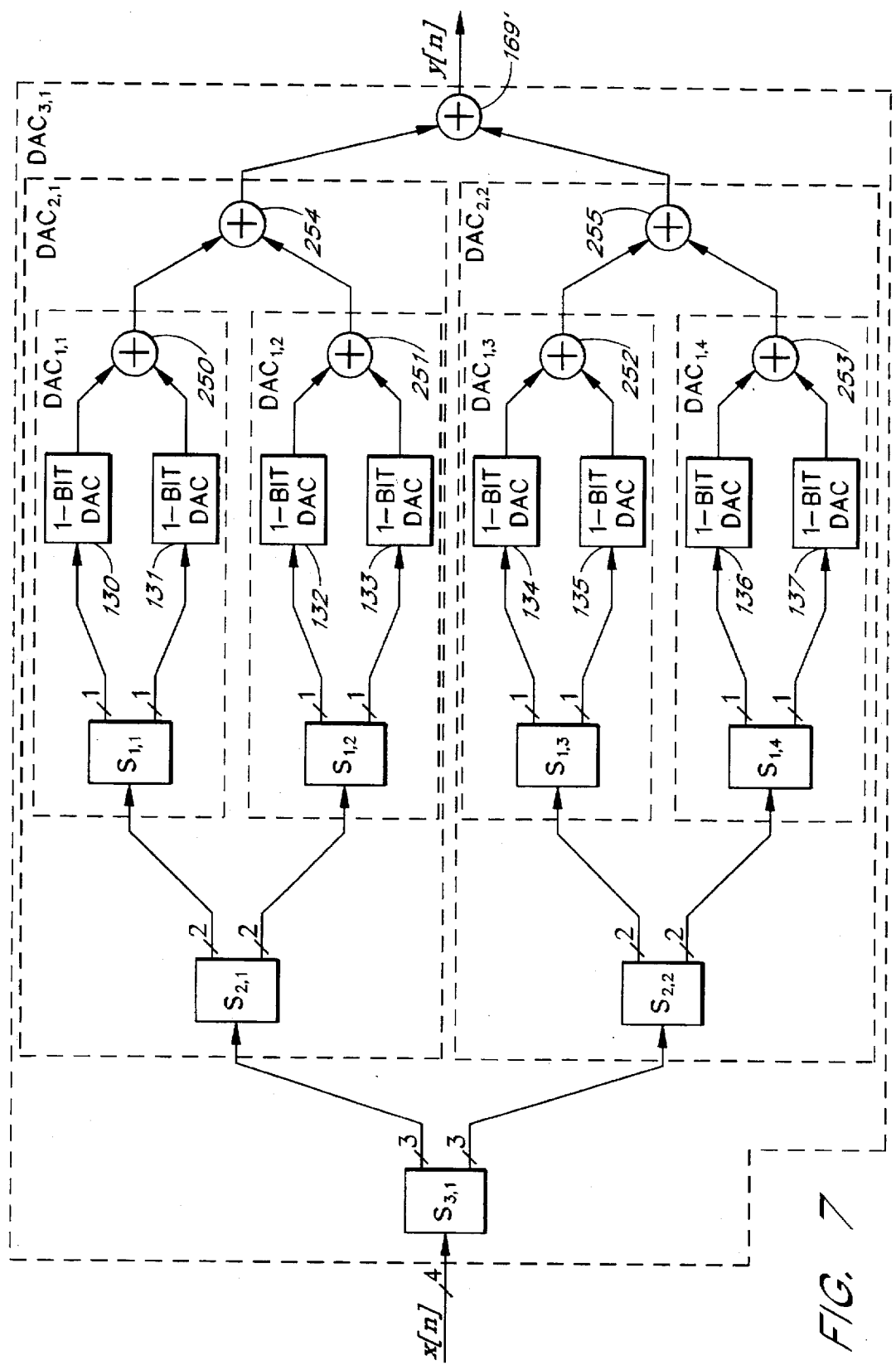
FIG. 7 is a block diagram of one example of the DAC topology of the present invention.

A functionally equivalent version of the DAC topology of FIG. 2 is shown in FIG. 7 from which the recursive nature of the system is evident. As can be appreciated, the structure of the two systems is identical from the input x[n] to the 1-bit DACs 130–137. The result of the six two-input adders 250–255 in FIG. 7 being placed before the two-input adder 169' is the same as inputs 160–167 feeding the eight-input adder 169 in FIG. 2. The value of y[n] will not change. However, with the adders 250–255, each subsystem enclosed in a dashed box is a DAC in its own right, and thus is referred to as a $DAC_{k,r}$, where k and r are the indices of the left-most switching block in the $DAC_{k,r}$. From a comparison of the notation in FIGS. 2 and 7, it follows that $DAC_{0,r}$ is the $r^{th}$ unit DAC-element, and $DAC_{3,1}$ is the 3-bit DAC itself.

As a means of explaining the recursive nature, FIG. 8a demonstrates a 4-bit DAC using the recursive nature of the invention demonstrated in FIG. 7. This 4-bit DAC is capable of converting a number up to 16. As described herein, although a five-bit number representing values of {0, 1, 2 . . . 16} can be input, this topology will be referred to as a 4-bit DAC to maintain consistency. The three-bit $DAC_{3,1}$ 280 of FIG. 7 is paired with another three-bit $DAC_{3,2}$ 282. These two three-bit DACs 280 and 282 combine with a switching block 284 having a 5-bit input 286. The switching block 284 splits the input into two 4-bit outputs 283 and 285. These 4-bit outputs are the inputs to the DACs 280 and 282. The 3-bit DACs each have an analog output 288 and 290 which are combined using an adder 291, creating a single output 292.

FIG. 8b demonstrates how, using the same technique as FIG. 8a, two 4-bit DACs can be used to create a 5-bit DAC to convert a number up to 32. As can be appreciated, the recursive nature of the present invention allows unlimited expansion.

Of course, numerous variations and modifications of the invention will become readily apparent to those skilled in the art. Accordingly, the scope of the invention should not be construed as limited to the specific embodiment depicted and described but rather, the scope is defined by the appended claims. The invention may be embodied in other specific forms without departing from its spirit or essential characteristics. The detailed embodiment is to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A digital-to-analog converter which converts an N-level digital input sequence to a nominally equivalent analog output sequence comprising:

a digital encoder which divides a sample of said N-level digital input sequence into multiple digital output values, wherein said digital encoder comprises two or more switching blocks, each switching block having a digital input and two digital outputs, and wherein the sum of said two digital outputs equals said digital input; and a converter which converts said multiple digital output values of said digital encoder to a nominal analog equivalent of a sum of said multiple digital output values.

2. The digital-to-analog converter of claim 1, wherein said digital encoder further comprises up to N−1 switching blocks denoted uniquely as $S_{k,r}$, wherein N is a positive power of two, k is an integer in the range $a \leq k \leq b$ with $b = \log_2(N)$ and a is a fixed number in the range $1 \leq a \leq b$, and r is an integer in the range $1 \leq r \leq N/2^k$, and wherein for each $a < k \leq b$, each said switching block $S_{k,r}$ has a first digital output $x_{k-1,2r-1}[n]$ and a second digital output $x_{k-1,2r}[n]$, wherein said first digital output is provided as an input to switching block $S_{k-1,2r-1}$ and said second digital output is provided as an input to switching block $S_{k-1,2r}$, and wherein said outputs of switching blocks $S_{a,r}$, where r=1, . . . , N/$2^a$, are said multiple digital outputs of said digital encoder, and wherein the input to switching block, $S_{b,1}$ receives said N-level digital input sequence.

3. The digital-to-analog converter of claim 2, wherein said first digital output $x_{k-1,2r-1}[n]$ of said switching block $S_{k,r}$ satisfies:

$$x_{k-1,2r-1}[n] = \frac{1}{2} (x_{k,r}[n] + s_{k,r}[n])$$

and said second digital output $x_{k-1,2r}[n]$ of said switching block $S_{k,r}$ satisfies:

$$x_{k-1,2r}[n] = \frac{1}{2} (x_{k,r}[n] - s_{k,r}[n]),$$

where $s_{k,r}[n]$ is a switching block control sequence generated by digital logic within the switching block, and wherein at least one of said $s_{k,r}[n]$ is nonconstant.

4. The digital-to-analog converter of claim 3, wherein each switching block control sequence $s_{k,r}[n]$ satisfies:

$$s_{k,r}[n] = \begin{cases} \text{even} & \text{if } x_{k,r}[n] \text{ is even;} \\ \text{odd} & \text{if } x_{k,r}[n] \text{ is odd;} \end{cases}$$

and $$|s_{k,r}[n]| \leq \min \{x_{k,r}[n], 2^k - x_{k,r}[n]\}.$$

5. The digital-to-analog converter of claim 3, wherein said switching block control sequence $s_{k,r}[n]$ is generated by a circuit comprising:

a gain element having an input, said gain element applying a −1 gain to said input to generate a gain element output;

a delay element having an input that receives said gain element output, said delay element delaying said gain element output to generate a delay element output;

a discrete time integrator having an input that receives said delay element output, said discrete time integrator generating an integrator output;

a hard limiter having an input that receives said integrator output, said hard limiter generating a limiter output; and a multiplier having a first input and a second input, wherein said first input receives a least significant bit of said digital input signal and said second input receives said limiter output, and wherein said multiplier multiplies said first input and said second input to generate a multiplier output, said multiplier output provided as an output of said circuit as said switching block control sequence $s_{k,r}[n]$, said control sequence $s_{k,r}[n]$ further provided as said input to said gain element.

6. The digital-to-analog converter of claim 3, wherein said switching block control sequence $s_{k,r}[n]$ is generated by a circuit comprising:

a first gain element having an input, said gain element applying a −1 gain to said input to generate a first gain element output;

a delay element having an input that receives said first gain element output, said delay element delaying said first gain element output and generating a delay element output;

a first discrete time integrator having an input that receives said delay element output, said first discrete time integrator integrating said delay element output to generate a first integrated output;

a first adder having a first input and a second input, said first input receiving said first gain element output, said second input receiving said first integrated output, said adder combining said first input and said second input to generate a first adder output;

a second discrete time integrator having an input that receives said first adder output, said second discrete time integrator generating a second integrated output;

a second adder having a first input and a second input, said first input receiving said first integrated output, said second input receiving said second integrated output, said second adder combining said first input and said second input to generate a second adder output;

a second gain element having an input that receives said second adder output, said second gain element applying a ¼ gain to said input to generate a second gain element output;

a quantizer having a first input and a second input, said first input receiving said second gain element output and said second input receiving a least significant bit of said digital input signal, said quantizer generating a quantizer output; and an amplitude limiter having a first input and a second input, said first input receiving said quantizer output and said second input receiving said digital input signal, said amplitude limiter limiting said first input and said second input to generate a limiter output, said limiter output provided as an output of said circuit as said switching block control sequence $s_{k,r}[n]$, said control sequence $s_{k,r}[n]$ further provided as said input to said first gain element.

7. The digital-to-analog converter of claim 6, wherein said quantizer has a step-size of $\Delta_q=2$, said quantizer performing midtread quantization when said least significant bit of said digital input signal is zero, said quantizer performing midrise quantization when said least significant bit of said digital input signal is non-zero.

8. The digital-to-analog converter of claim 2, wherein each switching block comprises:

a first clocked flip-flop, having an input and a first output, wherein said flip-flop is clocked by a least significant bit of said switching block input signal;

a second clocked flip-flop, having an input, a first output and a second output, wherein said second output of said second flip-flop is the inverse of said first output of said second flip-flop, wherein said first output of said first flip-flop is provided as the input to said second flip-flop, wherein said second flip-flop is clocked by said least significant bit of said switching block input signal, and wherein said second output of said second flip-flop drives said input to said first flip-flop;

a first adder that combines said switching block input signal and said first output of said second flip-flop to generate said first digital output of said switching block; and a second adder that combines said switching block input signal and said second output of said second flip-flop to generate said second digital output of said switching block.

9. The digital-to-analog converter of claim 1 wherein one or more of said switching blocks are dithered.

10. A digital-to-analog converter having a digital input representing a value and a single analog output, where said analog output is an analog equivalent of the input, said converter comprising:

at least one switching block layer interposed between said input and said output, each switching block layer containing at least one switching block having an input signal $x_{k,r}[n]$, and two output signals, $x_{k-1,2r-1}[n]$ and $x_{k-1,2r}[n]$, wherein each output signal has a value in the range $\{0, 1, \ldots, 2^{k-1}\}$, and $x_{k,r}[n]=x_{k-1,2r-1}[n]+x_{k-1,2r}[n]$, where k is the layer number and r identifies the switching block in the layer;

a plurality of digital-to-analog converters (DACs) each having an input and an output, said input to each DAC connected to receive one of said outputs of one of said switching blocks in the last switching block layer, where said output of each DAC is an analog equivalent of said input; and an output adder connected to receive said outputs of each DAC, wherein said output adder combines said DAC outputs into said single analog output.

11. The converter of claim 10, wherein each switching block has said input signal, $x_{k,r}[n]$, and wherein each switching block is controlled by a control signal $s_{k,r}[n]$, said control signal and said input signal cooperating to generate said output signals, wherein said control signal satisfies:

$$s_{k,r}[n] = \begin{cases} \text{even} & \text{if } x_{k,r}[n] \text{ is even;} \\ \text{odd} & \text{if } x_{k,r}[n] \text{ is odd;} \end{cases}$$

where $$|s_{k,r}[n]| \leq \min\{x_{k,r}[n], 2^k - x_{k,r}[n]\},$$

and where $$s_{k,r}[n] = x_{k-1,2r-1}[n] - x_{k-1,2r}[n].$$

12. The converter of claim 11, wherein said switching block control sequence $s_{k,r}[n]$ is generated by a circuit comprising:

a gain element having an input, said gain element applying a −1 gain to said input to generate a gain element output;

a delay element having an input that receives said gain element output, said delay element delaying said gain element output to generate a delay element output;

a discrete time integrator having an input that receives said delay element output, said discrete time integrator generating an integrator output;

a hard limiter having an input that receives said integrator output, said hard limiter generating a limiter output; and a multiplier having a first input and a second input, wherein said first input receives a least significant bit of said digital input signal and said second input receives said limiter output, and wherein said multiplier multiplies said first input and said second input to generate a multiplier output, said multiplier output provided as an output of said circuit as said switching block control sequence $s_{k,r}[n]$, said control sequence $s_{k,r}[n]$ further provided as said input to said gain element.

13. The converter of claim 11, wherein said switching block control sequence $s_{k,r}[n]$ is generated by a circuit comprising:

a first gain element having an input, said gain element applying a −1 gain to said input to generate a first gain element output;

a delay element having an input that receives said first gain element output, said delay element delaying said first gain element output and generating a delay element output;

a first discrete time integrator having an input that receives said delay element output, said first discrete time integrator integrating said delay element output to generate a first integrated output;

a first adder having a first input and a second input, said first input receiving said first gain element output, said second input receiving said first integrated output, said adder combining said first input and said second input to generate a first adder output;

a second discrete time integrator having an input that receives said first adder output, said second discrete time integrator generating a second integrated output;

a second adder having a first input and a second input, said first input receiving said first integrated output, said second input receiving said second integrated output, said second adder combining said first input and said second input to generate a second adder output;

a second gain element having an input that receives said second adder output, said second gain element applying a ¼ gain to said input to generate a second gain element output;

a quantizer having a first input and a second input, said first input receiving said second gain element output and said second input receiving a least significant bit of said digital input signal, said quantizer generating a quantizer output; and an amplitude limiter having a first input and a second input, said first input receiving said quantizer output and said second input receiving said digital input signal, said amplitude limiter limiting said first input and said second input to generate a limiter output, said limiter output provided as an output of said circuit as said switching block control sequence $s_{k,r}[n]$, said control sequence $s_{k,r}[n]$ further provided as said input to said first gain element.

14. The digital-to-analog converter of claim 13, wherein said quantizer has a step-size of $\Delta_q=2$, said quantizer performing midtread quantization when said least significant bit of said digital input signal is zero, said quantizer performing midrise quantization when said least significant bit of said digital input signal is non-zero.

15. The converter of claim 10, wherein said switching block comprises:

a first clocked flip-flop, having an input and a first output, wherein said flip-flop is clocked by a least significant bit of said switching block input signal;

a second clocked flip-flop, having an input, a first output and a second output, wherein said second output of said second flip-flop is the inverse of said first output of said second flip-flop, wherein said first output of said first flip-flop is provided as the input to said second flip-flop, wherein said second flip-flop is clocked by said least significant bit of said switching block input signal, and wherein said second output of said second flip-flop drives said input to said first flip-flop;

a first adder that combines said switching block input signal and said first output of said second flip-flop to generate a first of said two output signals of said switching block; and a second adder that combines said switching block input signal and said second output of said second flip-flop to generate a second of said two output signals of said switching block.

16. The converter of claim 10, wherein one or more of said switching blocks is dithered.

17. An element of a recursive digital-to-analog converter wherein each element is a digital-to-analog converter comprising:

a switching block interposed between said input and said output, said switching block having an input signal and first and second output signals of k bits, wherein each output signal has a value in the range $\{0, 1, \ldots, 2^{k-1}\}$, and wherein said input signal equals a sum of said output signals;

a first digital-to-analog converter (DAC) having an input and an output, said input to said first DAC connected to receive said first output of said switching block, where said output of said first DAC is an analog equivalent of said input;

a second DAC having an input and an output, said input to said second DAC connected to receive said second output of said switching block, where said output of said second DAC is an analog equivalent of said input; and an adder connected to receive said outputs of said first and second DAC, wherein said adder combines said DAC outputs into said single analog output.

18. A method of achieving digital-to-analog conversion, the method comprising the steps of:

(a) receiving a digital input signal in a first switching block layer of a plurality of switching block layers;

(b) splitting the digital signal into two output signals, wherein each of the two output signals has a value in the range $\{0, 1, \ldots, 2^{k-1}\}$, where k is a layer number, and wherein a sum of the output signals equals the digital input signal;

(c) repeating steps (a) and (b) for each of said plurality of switching block layers, where the output signals of a k layer are the digital input signals for a k–1 layer;

(d) converting output signals of a last switching block layer into a plurality of analog signals; and (e) combining the plurality of analog signals into a single converted signal.

19. A method of achieving digital-to-analog conversion, the method comprising the steps of:

(a) receiving a digital input signal in a switching block, where said input signal is a k+1 bit signal;

(b) splitting the digital signal into two output signals, wherein each of the two output signals has a value in the range $\{0, 1 \ldots, 2^{k-1}\}$, where k is the number of bits of each output signal, and wherein a sum of the output signals equals the digital input signal;

(c) converting said output signals into a first analog signal and a second analog signal; and (d) combining the first and second analog signals into a single convened signal.

* * * * *

UNITED STATES PATENT AND TRADEMARK OFFICE
CERTIFICATE OF CORRECTION

PATENT NO. : 5,684,482

DATED : November 4, 1997

INVENTOR(S) : Ian A. Galton

It is certified that error appears in the above-identified patent and that said Letters Patent is hereby corrected as shown below:

Column 18, line 24, please replace "convened signal" with --converted signal--.

Signed and Sealed this

Twelfth Day of May, 1998

Attest:

BRUCE LEHMAN

*Attesting Officer*         *Commissioner of Patents and Trademarks*